United States Patent [19]

Smolko et al.

[11] 4,130,855
[45] Dec. 19, 1978

[54] PASSIVE MICROCIRCUIT

[76] Inventors: Gennady G. Smolko, korpus 501, kv. 19; Gennady F. Vasiliev, korpus 331, kv. 93, both of Moscow; Nordari M. Chikovani, ulitsa Krylova, 10, Tbilisi, all of U.S.S.R.

[21] Appl. No.: 664,171

[22] Filed: Mar. 5, 1976

[30] Foreign Application Priority Data

Mar. 25, 1975 [SU] U.S.S.R. .............................. 2112851

[51] Int. Cl.² ............................................. H05K 7/20
[52] U.S. Cl. ................................... 361/387; 361/402; 428/901
[58] Field of Search ............... 317/100, 101 A, 101 C, 317/256, 243; 174/DIG. 5; 338/308; 361/322, 402, 411, 386, 387; 357/80; 428/901; 427/79, 96, 102

[56] References Cited

U.S. PATENT DOCUMENTS

| | | | |
|---|---|---|---|
| 3,593,107 | 7/1971 | Chilton | 317/256 |
| 3,679,471 | 7/1972 | Wyss | 338/308 |
| 3,680,028 | 7/1972 | Black | 338/308 |
| 3,895,272 | 7/1975 | Smolko et al. | 317/256 |

*Primary Examiner*—Gerald P. Tolin
*Attorney, Agent, or Firm*—Lackenbach, Lilling & Siegel

[57] ABSTRACT

A passive microcircuit is made, according to the invention, on a metal substrate, a dielectric layer being coated on at least one of its sides, whereon all components of the passive microcircuit, current-carrying tracks, pads, capacitor electrodes and resistors, are arranged. All the components and a dielectric layer of the passive microcircuit are based on the material of the metal substrate. The proposed passive microcircuit ensures dense wiring, directed heat removal, high reliability and shock- and vibration-proof properties, formation of RC-structures with distributed elements.

6 Claims, 1 Drawing Figure

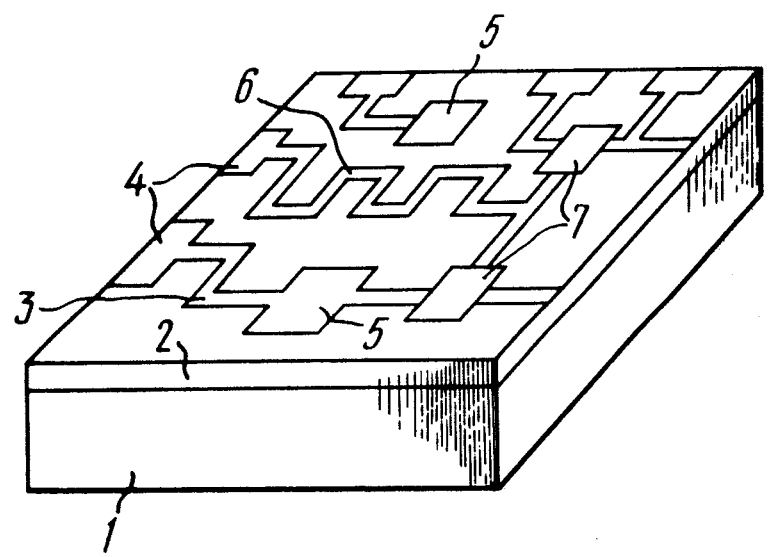

PASSIVE MICROCIRCUIT

This invention relates to microelectronics and, in particular, to passive microcircuits.

Passive microcircuits can be used in manufacturing hybrid integrated microcircuits for various purposes. In particular, it is most effective in microcircuits operating under strong vibration, mechanical overload and high temperatures.

There are known passive microcircuits made on a metal substrate, at least one side having an anode oxide film, whereon the circuit components and connections are arranged.

Said components in known circuits on metal substrates are made from different materials, but, when they are made from the substrate material, a sublayer of another metal or alloy is used.

In other known microcircuits a layer of metal is vacuumsputtered upon pyroceramic or silicon, as e.g. in tantalum technology. The metal is then coated by a 5,000–6,000 angstroms (Å) thick oxide film, whereon circuit components are arranged, but not on the material of the substrate, but of modifications of the sputtered metal. One of the capacitor electrodes is in this case made from gold.

The known thin-film microcircuits made on metal substrates or dielectric substrates with a metal sublayer are deficient in that heterogenous materials are used to form thin-film components in a microcircuit resulting in reduced reliability and output of undamaged microcircuit due to incompatible mechanical and temperature coefficients.

One more drawback of known thin-film microcircuits made on metal substrates or dielectric substrates with a metal sublayer is that employment of different materials to form components of a microcircuit makes it impossible to manufacture a circuit as a whole in one technological process.

An object of this invention is to provide a thin-film microcircuit on a metal substrate, wherein mechanical and temperature coefficients of materials employed are compatible.

Another object of this invention is to provide a thin-film microcircuit on a metal substrate, wherein all components can be manufactured in one technological process.

Yet another object of the invention is to provide a microcircuit on a metal substrate characterized by increased reliability and durability.

These and other objects are achieved in a passive microcircuit on a metal substrate with a dielectric layer, whereon current-carrying tracks, pads, capacitor electrodes and resistors are arranged, all said components of the passive microcircuit and said layer are, according to the invention, based on the material of the metal substrate.

It is expedient to make the metal substrate, current-carrying tracks, pads, capacitor electrodes from aluminum and resistors from aluminum oxynitride.

It is reasonable to make a dielectric layer from anodic aluminum oxide $Al_2O_3$ having a specified varied thickness.

The invention will now be described with reference to a specific emobdiment thereof taken in conjunction with the accompanying drawing, illustrating a plan view of a passive microcircuit, according to the invention.

A passive microcircuit comprises a metal substrate I, e.g. from aluminum, a dielectric layer, which is an anode oxide layer 2 made from $Al_2O_3$ aluminum current-carrying tracks 3, aluminum pads 4, aluminum electrodes of capacitors 5 and resistors 6 made from aluminum oxynitride.

The metal substrate I, which is a 1–3 mm thick aluminum sheet, is polished to mirror finish grade (of the order of 250–300 Å from peak to peak). An anode oxide layer 2, which is no less than 12 mm thick, is formed on at least one surface of said aluminum sheet, e.g. by two-stage oxidation.

During mechanical polishing the aluminum sheet acquires an oriented structure and the anode oxide layer formed thereon acquires, consequently, a specific texture, which ensures oriented heat removal.

The anode oxide layer 2 is grown by two-stage oxidation in electrolyte on the base of acetic acid $C_6H_8O_7 \cdot H_2O$.

A thin aluminum layer is formed, e.g. by cathode sputtering, on this anode oxide layer 2. Then the current-carrying tracks 3, the pads 4 and the upper capacitor electrodes 5 are made by means of photolithography in one etching operation.

The metal substrate 1, its previously formed components being protected, is again placed into the vacuum chamber to make the aluminum-based resistors 6.

While aluminum is being sputtered, nitrogen is fed into the chamber, its amount being a function of the required parameters of the resistors 6.

In this case the metal part of the substrate 1 acts as lower electrodes of the capacitors 5.

To reduce the capacitive coupling between the metal substrate 1, current-carrying tracks 3 and the pads 4, said oxide layer 2 is formed so that it is thicker under the current-carrying tracks 3 and the pads 4.

The proposed passive microcircuit ensures dense wiring, oriented heat removal, high reliability and shock and vibration resistance.

The foredescribed microcircuit makes it possible to form RC structures with distributed elements.

What is claimed is:

1. A passive microcircuit comprising: a metal substrate; a dielectric layer formed upon said metal substrate; current-carrying tracks, pads, capacitor electrodes and resistors, all being components of said passive microcircuit and arranged on said dielectric layer, all components and the dielectric layer being at least partially formed from the same material of said metal substrate, to closely match the temperature coefficients of expansion of the components, layer and substrate.

2. A passive microcircuit as claimed in claim 1, wherein said metal substrate, current-carrying tracks, pads, capacitor electrodes are made from aluminum, whereas said resistors are made from aluminum oxynitride.

3. A passive microcircuit as claimed in claim 1, wherein said dielectric layer is made from anode aluminum oxide $Al_2O_3$ and has a non-uniform thickness.

4. A passive microcircuit as claimed in claim 2, wherein said dielectric layer is made from anode aluminum oxide $Al_2O_3$ and has a non-uniform thickness.

5. A passive microcircuit as claimed in claim 3, wherein said dielectric layer is thicker under the current-carrying tracks and pads.

6. A passive microcircuit as claimed in claim 4, wherein said dielectric layer is thicker under the current-carrying tracks and pads.

* * * * *